US009262855B2

(12) United States Patent
Furtwangler et al.

(10) Patent No.: US 9,262,855 B2
(45) Date of Patent: Feb. 16, 2016

(54) STATELESS ANIMATION, SUCH AS BOUNCE EASING

(75) Inventors: Brandon C. Furtwangler, Bothell, WA (US); Saied Khanahmadi, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 981 days.

(21) Appl. No.: 12/726,897

(22) Filed: Mar. 18, 2010

(65) Prior Publication Data

US 2011/0227929 A1 Sep. 22, 2011

(51) Int. Cl.

| | |
|---|---|
| ***G06T 13/00*** | (2011.01) |
| ***G06F 7/60*** | (2006.01) |
| ***G06F 17/10*** | (2006.01) |
| *G06F 17/50* | (2006.01) |

(52) U.S. Cl.

CPC ............. *G06T 13/00* (2013.01); *G06F 17/5009* (2013.01)

(58) Field of Classification Search

CPC ................ G06T 13/00–13/80; G06T 2213/08; G06F 17/5009

USPC ......... 345/419, 420, 473, 474, 951, 953, 959; 703/2, 6, 7

See application file for complete search history.

(56) References Cited

U.S. PATENT DOCUMENTS

| | | | | |
|---|---|---|---|---|
| 7,636,093 | B1 * | 12/2009 | Kuwamoto .................. | 345/474 |
| 2002/0065046 | A1 | 5/2002 | Mankins et al. | |
| 2009/0309882 | A1 | 12/2009 | Kanyuk et al. | |

FOREIGN PATENT DOCUMENTS

| | | | |
|---|---|---|---|
| CN | 101075349 | A | 11/2007 |
| CN | 101266693 | A | 9/2008 |
| CN | 101452579 | A | 6/2009 |
| CN | 101578578 | A | 11/2009 |

OTHER PUBLICATIONS

Byron et al., "Animation & Shaping," Published: Oct. 2007, Retrieved: http://www.leebyron.com/else/shapetween/ on Apr. 2, 2013.*

Engel et al., Shaderx3: Advanced rendering with directx and opengl. (1st ed., pp. 119-122). Hingham, MA: Charles River Media, Inc., (2005).*

"Flipping"—comprising various screenshots taken from Byron et al., at: http://www.leebyron.com/else/shapetween/shaper_bounce.html.*

Fry, Ben, Visualizing Data. ($1^{st}$ ed., pp. 19-30). Sebastopol, CA: O'Reilly Media, Inc., (2008).*

(Continued)

*Primary Examiner* — Aniss Chad

(74) *Attorney, Agent, or Firm* — Aneesh Mehta; Kate Drakos; Micky Minhas

(57) ABSTRACT

An animation system is described herein that uses a transfer function on the progress of an animation that realistically simulates a bounce behavior. The transfer function maps normalized time and allows a user to specify both a number of bounces and a bounciness factor. Given a normalized time input, the animation system maps the time input onto a unit space where a single unit is the duration of the first bounce. In this coordinate space, the system can find the corresponding bounce and compute the start unit and end unit of this bounce. The system projects the start and end units back onto a normalized time scale and fits these points to a quadratic curve. The quadratic curve can be directly evaluated at the normalized time input to produce a particular output.

17 Claims, 4 Drawing Sheets

(56) References Cited

OTHER PUBLICATIONS

Garcia, Alejandro L., Physics of Paths of Action, (pp. 15-16, 19), Copyright Jul. 2009, Retrieved: http://animationphysics.org/wp-content/uploads/2012/12/PathAction_Tutorial.pdf on Apr. 2, 2013.*

Shareef, "Simulation of a Bouncing Ball Using Quadratic Equations," Document Dated: Oct. 5, 2005, Document Created: Oct. 2006, Retrieved: http://web.eece.maine.edu/~ashareef/Pre_Calculus/RelevantDocs/SimBounce/SimBounce.doc on Apr. 1, 2013.*

"First Office Action and Search Report Received for Chinese Application No. 201110072257.4", Mailed Date: Nov. 2, 2014, 18 pages.

"Second Office Action Received for Chinese Patent Application No. 201110072257.4", Mailed Date: Jul. 14, 2015, 13 pages.

* cited by examiner

STATELESS ANIMATION, SUCH AS BOUNCE EASING

BACKGROUND

Simulation is often used to approximate natural phenomena, such as the laws of physics, in software applications. For example, games often simulate real world experiences, such as racing, flying, and so forth. Simulation typically involves a complex software model designed to mimic behavior of a physical system. Software applies Inputs to the model similar to real world inputs. For example, a gravity simulator may receive inputs about the mass of an object, its aerodynamic properties, one or more forces applied to the object, and so forth.

Simulation can also be useful in user interface animation to increase the reality of interacting with objects experienced by users of the interface. For example, folders that animate from one location to another are easier to understand than those that simply disappear and reappear at another location. One type of user interface animation is a "bounce," which refers to the desirability of an object having some amount of elasticity as it moves from one location to another. For example, a software designer may want an object dragged from one location to another to bounce at the destination as it would if physically dropped. The bounce calls the user's attention to the object's new location and gives the object a more realistic feel, making the interface more pleasing to use.

Unfortunately, typical simulations are difficult to use for user interface animation and similar applications. It is often not feasible to setup and run a complex model that includes state information stored over time. The requirements of such models are resource intensive and do not allow for starting the simulation in the middle or even running the simulation in reverse. Rather, such models often are designed to run from start to finish uninterrupted. Animation for a user interface is typically more declarative, in that an application author knows a from and to value and wants an animation to occur for values in between. Such animations are more difficult than simple linear interpolation.

SUMMARY

An animation system is described herein that uses a transfer function on the progress of an animation that realistically simulates a bounce behavior. The transfer function maps normalized time and allows a user to specify both a number of bounces and a bounciness factor. Given a normalized time input, the animation system maps the time input onto a unit space where a single unit is the duration of the first bounce. In this coordinate space, the system can find the corresponding bounce and compute the start unit and end unit of this bounce. The system projects the start and end units back onto a normalized time scale and fits these points to a quadratic curve. The quadratic curve can be directly evaluated at the normalized time input to produce a particular output. Thus, the animation system provides a simulation for which: 1) the user has customizable control over the number of bounces and the bounciness, 2) the system can statelessly evaluate the output of the transfer function at any point without simulating prior states or output values, and 3) the resulting transfer function accurately simulates the motion of an object falling under gravity and bouncing with elastic collisions.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

An animation system is described herein that uses a transfer function on the progress of an animation that realistically simulates a bounce behavior (such as a bouncing ball). The transfer function maps normalized time and allows a user to specify both a number of bounces and a bounciness (relative amplitude between the peaks of two consecutive bounces). Given a normalized time input, the animation system maps the time input onto a unit space where a single unit is the duration of the first bounce. In this coordinate space, the system can find the corresponding bounce and compute the start unit and end unit of this bounce. The system projects the start and end units back onto a normalized time scale, calculates an amplitude of the bounce (to define a midpoint), and fits these points to a quadratic curve. The quadratic curve can be directly evaluated at the normalized time input to produce a particular output (e.g., height of the bounce at the given time). Thus, the animation system provides a simulation for which: 1) the user has customizable control over the number of bounces and the bounciness, 2) the system can evaluate the output of the transfer function at any point without simulating prior states or output values (i.e., stateless), and 3) the resulting transfer function accurately simulates the motion of an object falling under gravity and bouncing with friction (e.g., each bounce is symmetric and a duration of each bounce is proportional to its peak amplitude).

Unlike an absolute value of a sine wave with dampened exponential decay, the transfer function of the animation system provides for bounces that speed up properly at smaller bounces (i.e., the bounces are closer together as they would occur naturally), and whose amplitude is symmetric around peaks (i.e., the amplitude is not smaller after the bounce as would occur naturally if air friction is ignored). Symmetric bouncing is visually more accurate because air friction on this scale is negligible, so the only loss in energy is due to the collision with the ground between bounces. In addition, a sine wave with dampened exponential decay may not pass through a destination point as expected. Thus, although the animation system can be used with a variety of transfer functions, including sine wave based simulations, in its default implementation the system provides results that are more realistic.

Figure 1:
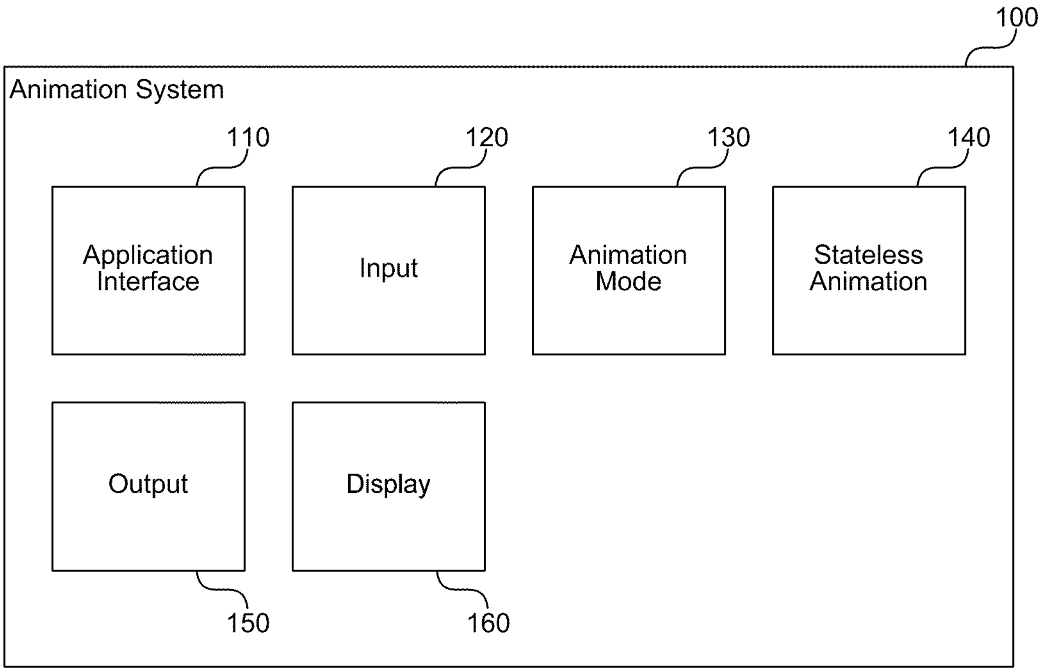
FIG. 1 is a block diagram that illustrates components of the animation system, in one embodiment.

FIG. 1 is a block diagram that illustrates components of the animation system, in one embodiment. The system 100 includes an application interface component 110, an input component 120, an animation mode component 130, a stateless animation component 140, an output component 150, and a display component 160. Each of these components is described in further detail herein.

The application interface component 110 provides an interface between a software application and the system 100. An application may include many user interface objects or other visual objects for which the animation provided by the system 100 produces a visually pleasing effect. Thus, the application may invoke the system to calculate an object's position during an animation so that the application can display the object appropriately. For example, an application may animate a bouncing ball or a window moving from one location to another with a bounce effect, and use the system to determine the object's position at regular intervals over a period of the animation. The application interface component 110 may include an object model, classes, functions, and other common application interface techniques for an application to provide data to the system 100 and receive one or more results.

The input component 120 receives one or more parameters that affect a particular animation. For example, the input component 120 may receive a bounciness coefficient and a current time at which the software application wants to determine the position of an object having the specified bounciness. The input component 120 may receive parameters based on initialization values of a declared class that inherits from a class provided by the system 100 as well as function parameters or other method of passing data between software components. The input component 120 may also receive an animation mode that it provides to the animation mode component 130 to alter behavior of the animation produced by the system 100.

The animation mode component 130 receives one or more animation modes from the software application and modifies behavior of the system 100 based on a received mode. In some embodiments, the animation system 100 provides multiple modes. For example, for a bounce animation, the system may allow an object to ease in (i.e., opposite of gravity, smaller to larger bounces), ease out (i.e., like an object dropped under the influence of gravity), or both ease in and out (i.e., start small and bounce to a peak, then trail off again). If an ease in is thought of as a function of time (f(t)) that provides amplitude on a unit scale, then ease out is the reverse (e.g., 1.0−f (1.0−t)).

The stateless animation component 140 determines a current animated value of an animated object based on a specified time. The stateless animation component 140 uses a stateless transfer function to determine the current animated value without performing a long simulation from the beginning to the current time. The software application may invoke the system repeatedly at regular intervals (e.g., in an animation loop) to determine a present position at which to display the animated object. The stateless animation component 140 may provide a variety of animation types or transfer functions through the animation mode component 130 that an application can select to obtain different animation behavior.

The output component 150 provides the current animated value of the animated object as a result to the software application. For example, the software application may invoke a class method of the system and receive the result as a return parameter. The animated value may include a position or other animated properties, such as color, rotation angle, and so forth. Although position is used herein as an example, a position may include these other types of animated values. The output component 150 may also communicate with a display component 160 to display the animated object. As the software application invokes the system 100 over time the output component 150 provides the current position of the animated object at whatever time is specified by the software application.

The display component 160 optionally displays the animated object. While the system 100 may be used in some embodiments by software applications that provide their own display capabilities and use the system 100 to receive position values and other animation characteristics, the system 100 may also be implemented in a manner in which the system 100 provides the displayed animation through the display component 170. The system may provide a default display capability that applications can override for more complex object types or animations.

The computing device on which the system is implemented may include a central processing unit, memory, input devices (e.g., keyboard and pointing devices), output devices (e.g., display devices), and storage devices (e.g., disk drives or other non-volatile storage media). The memory and storage devices are computer-readable storage media that may be encoded with computer-executable instructions (e.g., software) that implement or enable the system. In addition, the data structures and message structures may be stored or transmitted via a data transmission medium, such as a signal on a communication link. Various communication links may be used, such as the Internet, a local area network, a wide area network, a point-to-point dial-up connection, a cell phone network, and so on.

Embodiments of the system may be implemented in various operating environments that include personal computers, server computers, handheld or laptop devices, multiprocessor systems, microprocessor-based systems, programmable consumer electronics, digital cameras, network PCs, minicomputers, mainframe computers, distributed computing environments that include any of the above systems or devices, and so on. The computer systems may be cell phones, personal digital assistants, smart phones, personal computers, programmable consumer electronics, digital cameras, and so on.

The system may be described in the general context of computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments.

Figure 2:
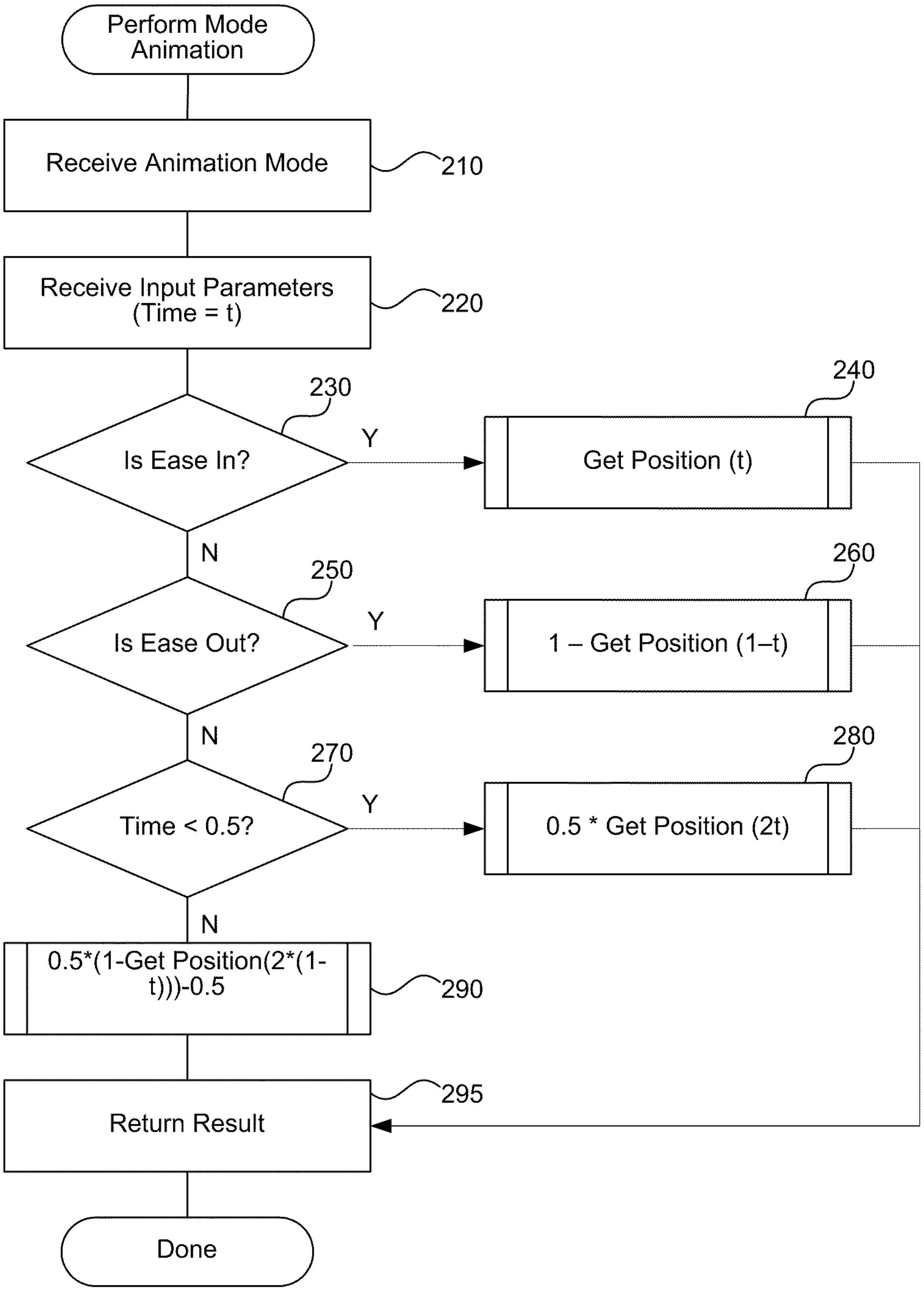
FIG. 2 is a flow diagram that illustrates processing of the animation mode component to select a mode, in one embodiment.

FIG. 2 is a flow diagram that illustrates processing of the animation mode component to select a mode, in one embodiment. Beginning in block 210, the component receives an animation mode that selects behavior of the animation system. For example, the mode may specify an ease in behavior, an ease out behavior, or both easing in and easing out behavior. Although shown serially, a software application invoking the system may declare an animation mode one time (e.g., by setting initialization parameters of a class) and call the animation system repeatedly with varying input parameters to receive an animated object's position over time. Continuing in block 220, the component receives input parameters based on a current time of the animation. Because the system does not track or store animation state, an application invoking the system specifies the current progress of the animation, such as through an input time. The application may also specify other parameters, such as a bounciness coefficient, that determines behavior of the system. For example, a higher bounciness coefficient may lead to animation that has greater amplitude in each bounce or that does not trail off as quickly.

Continuing in decision block 230, if the received animation mode specifies an ease in animation behavior, then the component continues at block 240, else the component continues at block 250. Continuing in block 240, the component invokes a stateless animation component to determine a current position of an animated object based on the received input parameters. In the example shown, an ease in animation is handled by the transfer function of the stateless animation component by default, so that the time is passed in directly (although it may be normalized first to a unit scale) to the stateless animation component to receive the appropriate resulting position back.

Continuing in decision block 250, if the received animation mode specifies an ease out animation behavior, then the component continues at block 260, else the component continues at block 270. Continuing in block 260, the component invokes a stateless animation component to determine a current position of an animated object based on the received input parameters. In the example shown, an ease in animation is handled by the transfer function of the stateless animation component by default, so that for an ease out behavior the time scale is reversed by passing 1.0 minus the input time. The result is also flipped by subtracting the result from 1.0 to receive the appropriate resulting position back.

Continuing in decision block 270 (corresponding to an ease in/out animation mode), if the received input time is less than 0.5 (halfway complete), then the component continues at block 280, else the component continues at block 290. Continuing in block 280, the component invokes a stateless animation component to determine a current position of an animated object based on the received input parameters. In the example shown, the first half of the animation is an ease in, and thus the input time is doubled and the result is cut in half. This fits an ease in animation to the first half of the unit time scale. If, on the other hand execution continues to block 290, where the second half of the animation is an ease out, then the input time is reversed, the result is flipped, and the animation is scaled to fit the appropriate half of the unit time scale.

Continuing in block 295, the component returns the result from the stateless animation component as a response to the caller. The result indicates a current position of the animated object in a particular coordinate system. After block 295, these steps conclude. Note that although the stateless animation component is shown here as producing a default ease in animation and the input parameters and result are modified to produce other behaviors, other transfer functions can be used with the system that may include a different default behavior and other modifications of the input parameters and result to produce different behaviors. Thus, the implementation shown is provided as an example to demonstrate one function of the system without limiting other possible implementations.

Figure 3:
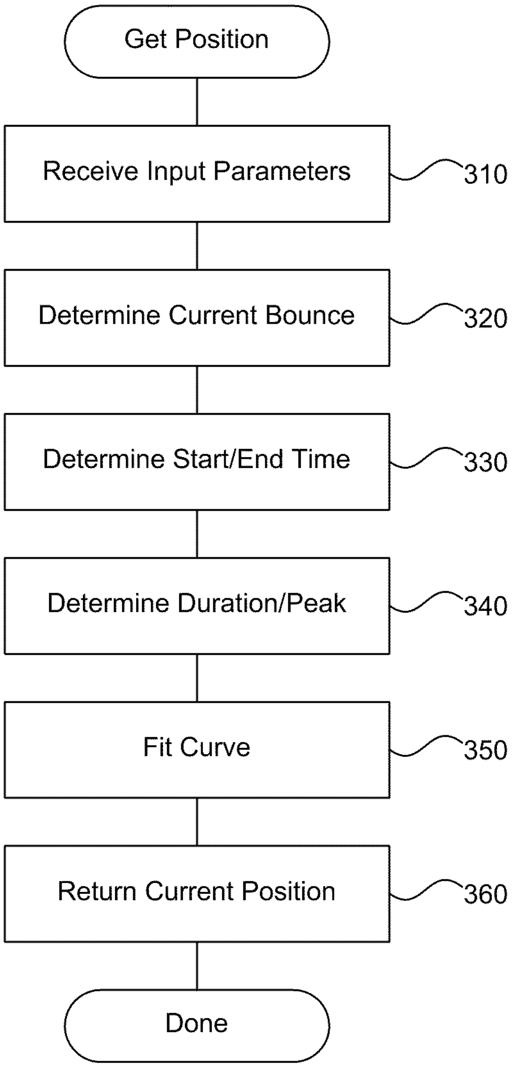
FIG. 3 is a flow diagram that illustrates processing of the stateless animation component to statelessly determine a current position of an animated object based on inputs, in one embodiment.

FIG. 3 is a flow diagram that illustrates processing of the stateless animation component to statelessly determine a current position of an animated object based on inputs, in one embodiment. Beginning in block 310, the component receives one or more input parameters that specify behavior and a current time of the animated object. For example, the input parameters may specify a current time, a bounciness coefficient, a number of bounces requested for the full animation, and so forth. Continuing in block 320, the component determines a current bounce based on the received input parameters. Based on the current time and number of bounces, the component can determine the current bounce. For example, if there are five total bounces and time is near the end of the animation (1.0 in unit time), then the current bounce may be the fifth bounce.

Continuing in block 330, the component projects a start and end time of the current bounce into time space. The component can determine the start and end times based on the current bounce and the bounciness coefficient. A proper bounce takes less and less time as the animation progresses (for ease out). Many bounce techniques fail to properly simulate this aspect of bouncing animation, unlike the animation system described herein. Continuing in block 340, the component determines a duration and peak of the current bounce to which to fit a curve. For example, the peak can be found at the mid-point of the start and end time, and the amplitude of the peak can be determined based on the bounciness coefficient.

Continuing in block 350, the component determines a curve that fits the determined start time, end time, and peak of the current bounce. For example, the system may fit a quadratic curve that passes through the start and end time points and peaks at an amplitude that matches the bounce peak. Continuing in block 360, the component returns a resulting position based on the determined curve and the received input parameters. The time specified in the input parameters will determine which position on the fit curve to return. Note that no state is stored by the steps described herein between iterations. The system can efficiently determine the current position based on the received input parameters without executing a costly simulation from start to finish (or from start to a current time). After block 360, these steps conclude.

A bounce transfer function as described herein may be a function of three input parameters: number of bounces (α), bounciness (β), and time (t). The bounciness is a relative duration between two consecutive bounces. For example, a bounciness of two means that the second bounce is twice as high as the first bounce. Time is normalized time between 0 and 1. In some embodiments, given the input values above, the bounce transfer function follows the steps below to compute the bounce height.

1. $\text{pow} = \beta^{\alpha}$

2. $oneMinusBounciness = 1 - \beta$

3. $sumOfUnits = \frac{(1 - \text{pow})}{oneMinusBounciness} + \frac{\text{pow}}{2}$ This value is the total sum of the durations of all bounces in unit scale. A single unit is the duration of the first bounce. The second term in the above equation compensates for the final half bounce.

4. unitAtT=t*sumOfUnits

Maps the normalized time input onto the unit scale.

5. bounceAtT=$\log_{\beta}$(1−unitAtT*oneMinusBounciness)

Computes which bounce the animation would be in based on the normalized time. This will give, e.g., 2.3, which means t is 30% into the second bounce.

6. start=⌊bounceAt⌋, end=start+1

Truncate the previous value to the nearest integer less than bounceAtT. 2.3 will become 2 for start and 3 for end.

7. $startTime = \frac{1 - \beta^{start}}{oneMinusBounciness * sumOfUnits}$, $$endTime = \frac{1 - \beta^{end}}{oneMinusBounciness * sumOfUnits}$$

8. Given the start time and end time of the bounce (in the normalized time scale), the system computes the duration and the peak of the curve, and then fits a quadratic curve given these set of points.

9. The final step in evaluating the bounce transfer function is to evaluate this quadratic equation at time t:

$$midtime = \frac{startTime + endTime}{2}$$

$$timeRelToPeak = normalizedTime - midTime$$

$$\text{radius} = midTime - startTime$$

$$\text{amplitude} = \left(\frac{1}{\beta}\right)^{bounces-start}$$

$$\text{output} = -\frac{\text{amplitude}}{radius^2}(timeRelToPeak - \text{radius})(timeRelToPeak + \text{radius})$$

Figure 4:
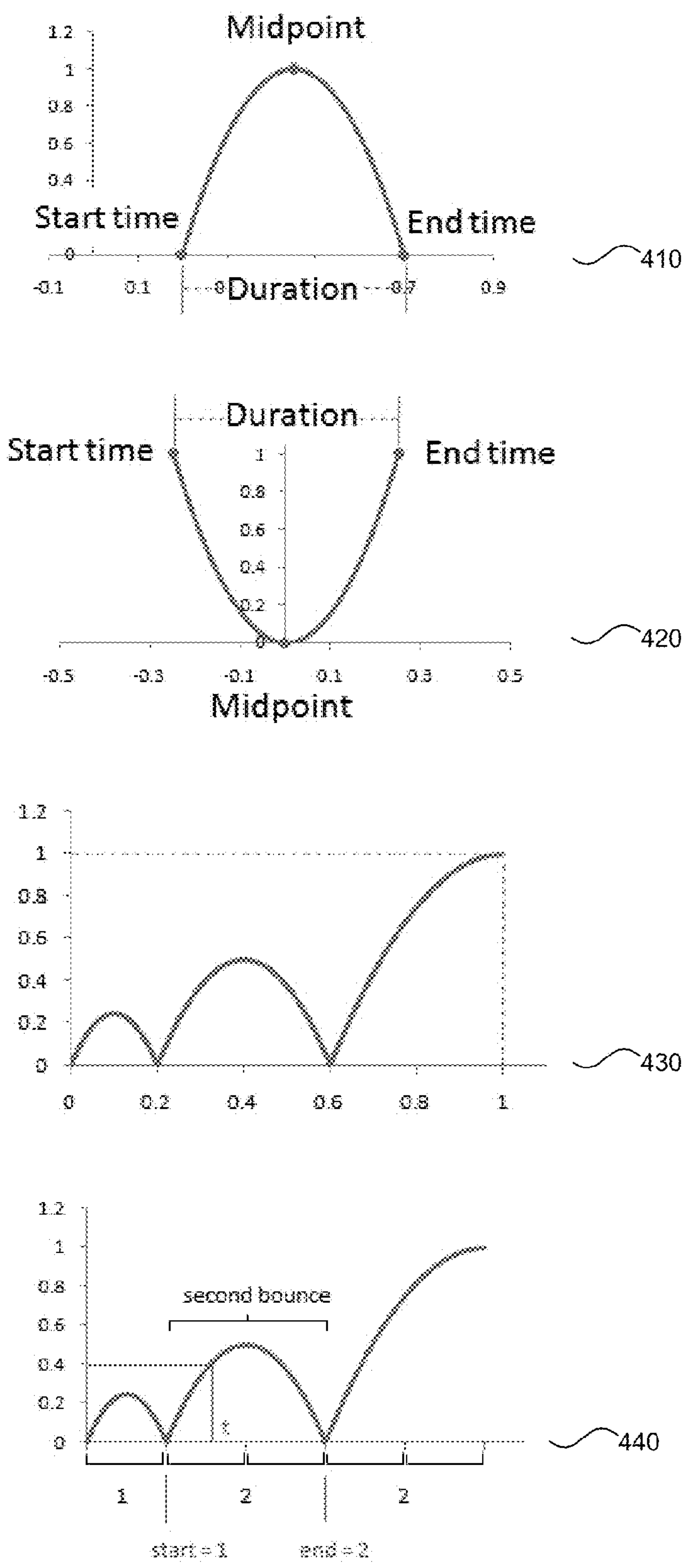
FIG. 4 is diagram of four graphs that show an example of the bounce transfer function described herein, in one embodiment.

FIG. 4 is diagram of four graphs that show an example of the bounce transfer function described herein, in one embodiment. The graph 410 shows the start time, end time, duration, and midpoint corresponding to a current bounce as described in step 8 above. Given the three points shown, the system can find a quadratic curve that contains these points. The curve peaks at a point that is equidistant to both the start and end time, a point labeled midpoint. It is easier to find this curve if the system maps these points to the origin of the XY-axis. Thus, graph 420 shows the same points with the midpoint at the origin. Once found, the system can flip the curve and translate it to its appropriate location. The graph 410 shows the fit curve flipped and translated to the correct position for a particular set of inputs.

The graph 430 shows a sample bounce function. The transfer function for a bounce has a domain in the 0-1 range and a range in the 0-1 range. The bounces are computed such that the peak of the last bounce is at 1.0. The number of bounces for a bounce function does not include the last half bounce bringing it back to the peak. Thus, the graph 430 shows a bounce function with two bounces. The graph 440 shows the same bounce function with additional parameters defined by the animation system. The system defines a duration of the first bounce to be one unit. The duration of subsequent bounces depends on the bounciness factor. For inputs $\alpha=2$ and $\beta=2$, then the total units will be five (1 for first bounce+2 for second bounce+4/2 for the last half bounce to get back to the peak of the bounce). In graph 440 the current time t is part way into the second bounce so start will be 1 and end will be 2.

The following example C# code shows one possible implementation of the steps described herein and illustrated further with reference to FIGS. 2 and 3. The EaseInCore function provides a function that returns a current position for an ease in type of bounce animation based on input parameters that specify a current normalized time, a number of bounces, and a bounciness factor. The Ease function wraps the EaseInCore function to provide other animation modes, such as ease out and ease in/out, as described further herein.

```
protected override double EaseInCore(double normalizedTime)
{
    // The math below adheres to the following goals to get the correct
    // look for a bounce:
    //  1)  The bounces will be symetrical
    //  2)  Bounciness will control both the amplitude and the period
    //      of the bounces
    //  3)  Bounces will control the number of bounces without
    //      including the final half bounce to get back to 1.0
    //
    // Constants
    double bounces = Math.Max(0.0, (double)Bounces);
```

-continued

```
    double bounciness = Bounciness;
    // Clamp the bounciness to avoid divide by zero
    if (bounciness < 1.0 || DoubleUtil.IsOne(bounciness))
    {
        // Make it just over one.  In practice, this will look like 1.0
        // but avoid divide by zero errors.
        bounciness = 1.001;
    }
    double pow = Math.Pow(bounciness, bounces);
    double oneMinusBounciness = 1.0 − bounciness;
    // 'unit' space calculations.
    // Bounces grow in the x axis exponentially.  The
    // first bounce has a 'unit' width of 1.0 and
    // the total number of 'units' is determined using a geometric
    // series, then compute which 'unit' the current time is in.
    double sumOfUnits = (1.0 − pow) / oneMinusBounciness +
    pow * 0.5;
    double unitAtT = normalizedTime * sumOfUnits;
    // 'bounce' space calculations.
    // Knowing which 'unit' the current time is in, this can
    // determine which bounce the animation is in by solving the
    // following geometric equation for bounce:
    // unitAtT = (1 − bounciness^bounce) / (1 − bounciness)
    double bounceAtT = Math.Log(−unitAtT * (1.0−bounciness) + 1.0,
        bounciness);
    double start = Math.Floor(bounceAtT);
    double end = start + 1.0;
    // 'time' space calculations.
    // Project the start and end of the bounce into 'time' space
    double startTime = (1.0 − Math.Pow(bounciness, start)) /
        (oneMinusBounciness * sumOfUnits);
    double endTime = (1.0 − Math.Pow(bounciness, end)) /
        (oneMinusBounciness * sumOfUnits);
    // Curve fitting for bounce.
    double midTime = (startTime + endTime) * 0.5;
    double timeRelativeToPeak = normalizedTime − midTime;
    double radius = midTime − startTime;
    double amplitude = Math.Pow(1.0 / bounciness, (bounces − start));
    // Evaluate a quadratic that hits (startTime,0), (endTime, 0), and
    // peaks at amplitude.
    return (−amplitude / (radius * radius)) * (timeRelativeToPeak −
        radius) * (timeRelativeToPeak + radius);
}
public double Ease(double normalizedTime)
{
    switch (EasingMode)
    {
        case EasingMode.EaseIn:
            return EaseInCore(normalizedTime);
        case EasingMode.EaseOut:
            // EaseOut is the same as EaseIn, except time is reversed
            // and the result is flipped.
            return 1.0 − EaseInCore(1.0 − normalizedTime);
        case EasingMode.EaseInOut:
        default:
            // EaseInOut is a combination of EaseIn and EaseOut fit to
            // the 0-1, 0-1 range.
            return (normalizedTime < 0.5) ?
                EaseInCore(         normalizedTime    * 2.0 ) *
                0.5 : (1.0 − EaseInCore((1.0 − normalizedTime) *
                2.0)) *0.5 + 0.5;
    }
}
```

In some embodiments, the animation system is implemented in an application-programming interface (API) that developers can invoke to provide animations for their software applications. For example, implementations of the animation system are currently provided in the SILVERLIGHT™ 3.0 and WINDOWS™ Presentation Foundation 4.0 APIs. The animation system can also be integrated into a single software application or packaged differently in other APIs or graphics libraries as appropriate for a particular application.

The stateless nature of the animation provided by the animation system allows common user interface paradigms to be implemented more easily. For example, because the system can efficiently determine a position of the animation at any given time, it is easy to reverse the animation or seek to a particular position in the animation simply by specifying the right time parameters. Thus, recording of user interface (UI) behavior and later playback are provided inherently by the system. Previous simulation techniques become unwieldy in such situations.

In some embodiments, the animation system caches parts of the bounce transfer function. For example, for a given bounciness and bounce, it is possible for the system to avoid determining a curve at every call and the system can instead cache the determined curve and use the cached curve to respond to later calls to the transfer function. Such techniques are optimizations that do not affect the results provided by the system but may improve the efficiency, particularly for performance sensitive uses of the system (e.g., a user interface function invoked at high frequency).

In some embodiments, the animation system may be provided as a delegate or via inheritance rather than as an interface. An interface has the advantage integrating more easily with declarative systems, such as an Extensible Application Markup Language (XAML)-based declarative user interface definition. However, it is also possible to provide the system to third party code using other programming techniques such as delegates, was will be recognized by those of ordinary skill in the art. The system may also provide, in some embodiments, its own internal clock that progresses the animation forward and calls out to an external software application with the progress of the animation. These and other variations are not explicitly described herein but are within the skill of those skilled in the art.

From the foregoing, it will be appreciated that specific embodiments of the animation system have been described herein for purposes of illustration, but that various modifications may be made without deviating from the spirit and scope of the invention. Accordingly, the invention is not limited except as by the appended claims.

We claim:

1. A computer-implemented method for statelessly determining a current position of an animated object, the method comprising:

- receiving one or more input parameters that specify behavior and a current time of the animated object and a total number of bounces;
- determining a current bounce among the total number of bounces based on the received input parameters wherein all bounces in the total number of bounces are determinable from the one or more input parameters and the current time and where the one or more input parameters does not include input parameters corresponding to other bounces in the total number of bounces;
- projecting a start and end time of the current bounce into time space;
- determining a duration and peak of the current bounce to which to fit a curve;
- determining the curve that fits the determined start time, end time, and peak of the current bounce; and
- returning a resulting position based on the determined curve and the received input parameters,
- wherein the preceding steps are performed by at least one processor.

2. The method of claim 1 wherein receiving one or more input parameters comprises receiving a bounciness factor that indicates a relative duration between two consecutive bounces.

3. The method of claim 1 wherein determining a current bounce comprises identifying the current time and the total number of bounces, and based on the current time determining the current bounce.

4. The method of claim 1 wherein projecting a start and end time comprises determining where the current bounce starts and ends on a time scale based on the current bounce and a bounciness factor.

5. The method of claim 1 wherein projecting a start and end time comprises determining that the duration is a duration that decreases as an animation progresses.

6. The method of claim 1 wherein determining a duration and peak comprises locating a mid-point of the start and end times and determining an amplitude of the peak based on a bounciness factor.

7. The method of claim 1 wherein determining a curve comprises fitting a quadratic curve that passes through the start and end times and peaks at an amplitude that matches the determined peak.

8. The method of claim 1 wherein returning a resulting position comprises providing a return value in response to an application programming interface (API) invoked by a software application.

9. A computer system for providing stateless animation information that simulates a physical bounce of an animated object, the system comprising:

- a processor and memory configured to execute software instructions;
- an application interface component configured to provide an interface between a software application and an animation system running on the computer system;
- an input component configured to receive one or more parameters that affect a particular animation the one or more parameters including a bounciness coefficient, a current time for which to determine an animated value that comprises a position of the animated object and a total number of bounces in a full animation sequence, wherein the one or more parameters relating only to a current bounce within the total number of bounces;
- an animation mode component configured to receive an animation mode from the software application and modify behavior of the animation system based on the received mode;
- a stateless animation component configured to determine a current animated value of the animated object based on the current time, to determine a current bounce number within the total number of bounces based on the one or more parameters, wherein the current time is a time within an animation sequence;
- an output component configured to provide the determined current animated value of the animated object as a result to the software application.

10. The system of claim 9 wherein the application interface component is further configured to provide an interface with a method that the software application invokes to determine the animated value of the animated object at a specified time.

11. The system of claim 9 wherein the input component is further configured to receive the one or more parameters based on initialization values of a declared class that inherits from a class provided by the system.

12. The system of claim 9 wherein the animation mode component is further configured to select a bounce animation mode from the group consisting of an ease in animation, an ease out animation, and an ease in/out animation.

13. The system of claim 9 wherein the stateless animation component is further configured to invoke a stateless transfer function to determine the current animated value without performing a simulation from a beginning to the current time.

14. The system of claim 9 further comprising a display component configured to display the animated object based on the determined animated value.

15. A computer implanted method, the method comprising:

receiving an animation mode selection that selects behavior of an animation system;

receiving one or more input parameters based on a current state of the animation, wherein the animation system does not store animation state information between steps of the animation, wherein the one or more input parameters is based on a current time in a middle of the animation;

determining a modification of the input parameters based on the received mode;

invoking a stateless animation component to determine a current position based on the modification of the input parameters;

applying reversing and/or flipping to the determined current position based on the received mode; and returning the reversed and/or flipped current position as a response wherein the preceding steps are executed by at least one processor.

16. The method of claim 15 wherein receiving an animation mode selection comprises receiving at least one of an ease in behavior, an ease out behavior, and an ease in/out behavior.

17. The method of claim 15 wherein the input parameters include a bounciness coefficient that allows a software application to invoke the animation system with customized behavior.

* * * * *